United States Patent
Lu et al.

(10) Patent No.: US 11,196,397 B2
(45) Date of Patent: Dec. 7, 2021

(54) CURRENT INTEGRATOR FOR OLED PANEL

(71) Applicant: NOVATEK Microelectronics Corp., Hsin-Chu (TW)

(72) Inventors: Chih-Wen Lu, Hsinchu (TW); Chieh-An Lin, Taipei (TW); Yen-Ru Kuo, Hsinchu County (TW); Jhih-Siou Cheng, New Taipei (TW); Ju-Lin Huang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/731,041

(22) Filed: Dec. 31, 2019

(65) Prior Publication Data

US 2021/0203291 A1 Jul. 1, 2021

(51) Int. Cl.
*G09G 3/3225* (2016.01)
*H03F 3/45* (2006.01)

(52) U.S. Cl.
CPC ....... *H03F 3/45188* (2013.01); *G09G 3/3225* (2013.01); *G09G 2330/00* (2013.01); *H03F 2200/129* (2013.01); *H03F 2200/156* (2013.01); *H03F 2200/231* (2013.01); *H03F 2200/234* (2013.01); *H03F 2200/267* (2013.01); *H03F 2203/45004* (2013.01); *H03F 2203/45116* (2013.01); *H03F 2203/45152* (2013.01); *H03F 2203/45156* (2013.01); *H03F 2203/45171* (2013.01); *H03F 2203/45174* (2013.01); *H03F 2203/45514* (2013.01)

(58) Field of Classification Search
CPC .......... G09G 3/36; G09G 3/20; G09G 3/3208; G09G 3/3406; G09G 3/3648; G09G 5/10; G09G 2310/08; G09G 3/3225; H03M 1/12

See application file for complete search history.

(56) References Cited

U.S. PATENT DOCUMENTS

| | | | | |
|---|---|---|---|---|
| 4,050,065 A | * | 9/1977 | Mosley | ................... H03M 1/52 |
| | | | | 341/118 |
| 4,138,649 A | * | 2/1979 | Schaffer | .................. H03F 1/303 |
| | | | | 330/303 |
| 4,567,465 A | * | 1/1986 | Komiya | ................... H03M 1/52 |
| | | | | 341/168 |
| 5,841,310 A | * | 11/1998 | Kalthoff | ............... G06G 7/1865 |
| | | | | 327/337 |
| 5,880,634 A | * | 3/1999 | Babanezhad | ...... H03H 11/1252 |
| | | | | 330/126 |
| 6,480,178 B1 | * | 11/2002 | Itakura | ................. G09G 3/3688 |
| | | | | 345/89 |
| 6,664,941 B2 | * | 12/2003 | Itakura | ................. G09G 3/3688 |
| | | | | 345/89 |

(Continued)

*Primary Examiner* — Olga V Merkoulova
(74) *Attorney, Agent, or Firm* — Winston Hsu

(57) ABSTRACT

The present invention includes a current integrator for an organic light-emitting diode (OLED) panel. The current integrator includes an operational amplifier, which includes an output stage. The output stage, coupled to an output terminal of the current integrator, includes a first output transistor, a second output transistor, a first stack transistor and a second stack transistor. The first stack transistor is coupled between the first output transistor and the output terminal. The second stack transistor is coupled between the second output transistor and the output terminal.

6 Claims, 5 Drawing Sheets

(56) References Cited

U.S. PATENT DOCUMENTS

| | | | | |
|---|---|---|---|---|
| 6,731,263 B2* | 5/2004 | Goto | G09G 3/3688 | 345/100 |
| 6,906,648 B1* | 6/2005 | Koike | H03M 1/0697 | 341/118 |
| 7,006,070 B2* | 2/2006 | Ishiyama | G09G 3/2011 | 330/282 |
| 7,079,123 B2* | 7/2006 | Shino | G09G 3/2092 | 345/100 |
| 7,095,354 B2* | 8/2006 | Harrison | H03M 1/0609 | 341/155 |
| 7,342,449 B2* | 3/2008 | Ishii | H03F 3/45179 | 330/253 |
| 7,436,248 B2* | 10/2008 | Furuichi | G05F 3/262 | 323/316 |
| 7,463,254 B2* | 12/2008 | Shino | G09G 3/2092 | 345/100 |
| 7,486,267 B2* | 2/2009 | Chen | G09G 3/3677 | 345/100 |
| 7,746,336 B2* | 6/2010 | Morita | G09G 3/3688 | 345/211 |
| 7,843,447 B2* | 11/2010 | Okuno | G09G 3/3655 | 345/212 |
| 7,928,939 B2* | 4/2011 | Chung | G09G 3/2014 | 345/82 |
| 8,022,916 B2* | 9/2011 | Lee | G09G 3/3655 | 345/94 |
| 8,410,962 B2* | 4/2013 | Shibata | H03H 11/1252 | 341/143 |
| 9,065,480 B1* | 6/2015 | Tseng | H03M 3/388 | |
| 9,275,596 B2* | 3/2016 | Suzuki | G09G 3/3688 | |
| 9,793,805 B2* | 10/2017 | Nedovic | H02M 3/158 | |
| 10,804,865 B1* | 10/2020 | Lin | H03F 3/303 | |
| 2003/0146923 A1* | 8/2003 | Nakahira | H03F 3/45753 | 345/690 |
| 2004/0001039 A1* | 1/2004 | Shino | G09G 3/2092 | 345/100 |
| 2009/0140802 A1* | 6/2009 | Kitagawa | H03M 1/0663 | 330/9 |
| 2013/0057331 A1* | 3/2013 | Yuan | H03F 3/183 | 327/341 |
| 2015/0069386 A1* | 3/2015 | Osada | H01L 29/7869 | 257/43 |
| 2016/0240122 A1* | 8/2016 | Yu | G09G 3/006 | |
| 2016/0294283 A1* | 10/2016 | Nedovic | H02M 1/08 | |

* cited by examiner

CURRENT INTEGRATOR FOR OLED PANEL

BACKGROUND OF THE INVENTION

1. Field of the Invention

The present invention relates to a current integrator, and more particularly, to a current integrator for an organic light-emitting diode (OLED) panel.

2. Description of the Prior Art

An organic light-emitting diode (OLED) is a light-emitting diode (LED) in which the emissive electroluminescent layer is a film of organic compound, where the organic compound can emit light in response to an electric current. OLEDs are widely used in display panels of electronic devices such as television screens, computer monitors, and portable systems such as mobile phones, handheld game consoles and personal digital assistants (PDAs). An active matrix OLED (AMOLED), which is driven by a thin-film transistor (TFT) which contains a storage capacitor that maintains the pixel states to enable large size and large resolution displays, becomes the mainstream of the OLED displays.

After a long-time operation of an OLED panel, several parameters in the OLED panel, such as the threshold voltage of the TFT, may undergo degradations or variations with different extents through different pixels. In order to improve the uniformity of the OLED panel, the variations of these parameters need to be compensated, and the characteristics of the parameters should be sensed in order to determine the compensation degree for each pixel cell. In general, during the sensing process, the information of degradations or variations of the OLED pixels may be read out as a current signal, which is received by a current integrator.

The current integrator usually includes an operational amplifier. Considering stability issue of the operational amplifier, a Miller compensation capacitor may be disposed at the output terminal of the operational amplifier. During the integration process, the received current may charge any capacitors, including an integration capacitor, the Miller compensation capacitor, and any other parasitic capacitors, coupled to the output terminal of the current integrator. The integration capacitor is configured to store the integration information, but it is charged after the Miller compensation capacitor and other parasitic capacitors are fully charged. In other words, a part of the received input current does not flow to the target integration capacitor, resulting in deviations on the output signal of the current integrator.

This problem may be solved by compensating the integration result in the back-end circuit. However, the integration time may be configured differently for various applications, such that the loss of charges or currents due to the parasitic capacitors has different ratios, which results in an unpredictable error on the output signal of the current integrator. Thus, it is uneasy to determine the required gain and offset for compensating the integration result.

SUMMARY OF THE INVENTION

It is therefore an objective of the present invention to provide a current integrator for an organic light-emitting diode (OLED) panel, where the output result of the current integrator is more immune to the influence of parasitic capacitors of the operational amplifier.

An embodiment of the present invention discloses a current integrator for an OLED panel. The current integrator includes an operational amplifier, which includes an output stage. The output stage, coupled to an output terminal of the current integrator, includes a first output transistor, a second output transistor, a first stack transistor and a second stack transistor. The first stack transistor is coupled between the first output transistor and the output terminal. The second stack transistor is coupled between the second output transistor and the output terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
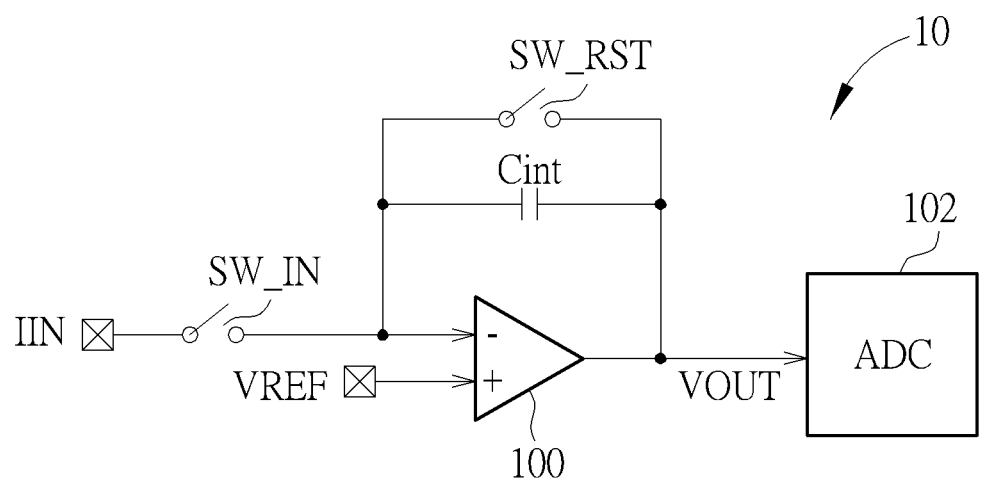
FIG. 1 is a schematic diagram of a current integrator according to an embodiment of the present invention.

Please refer to FIG. 1, which is a schematic diagram of a current integrator 10 according to an embodiment of the present invention. As shown in FIG. 1, the current integrator 10 includes an operational amplifier 100, an integration capacitor Cint, an input switch SW_IN and a reset switch SW_RST. The current integrator 10 is configured to receive input current signals IIN from an organic light-emitting diode (OLED) panel, and integrate the input current signals IIN over a predetermined period. With the switched capacitor operation of the switches SW_IN and SW_RST, the operational amplifier 100 may be reset in a phase and configured to receive the input current signal IIN in another phase, where electric charges corresponding to the input current signal IIN may be received and stored in the integration capacitor Cint. Other possible circuit elements such as an offset cancelation capacitor and related coupling switches may be included in the current integrator 10 or not, and are omitted in FIG. 1 for brevity. An analog-to-digital converter (ADC) 102 may not be included in the current integrator 10, but is illustrated in FIG. 1 to show that the output signal VOUT of the operational amplifier 100 is sent to the ADC 102 to be converted into digital data. In an embodiment, the ADC 102 may be coupled to multiple current integrators, for receiving output signals from the current integrators by turns.

In an embodiment, the operational amplifier 100 may be a differential amplifier, which includes a differential input stage and a single-ended output stage. In the differential input stage, a negative input terminal may be coupled to the input terminal of the current integrator 10, for receiving the input current signal IIN, and a positive input terminal may be configured to receive a reference voltage VREF. The output terminal of the operational amplifier 100, which is coupled to the output terminal of the current integrator 10, may be configured to output the output signal VOUT to the ADC 102.

Figure 2:
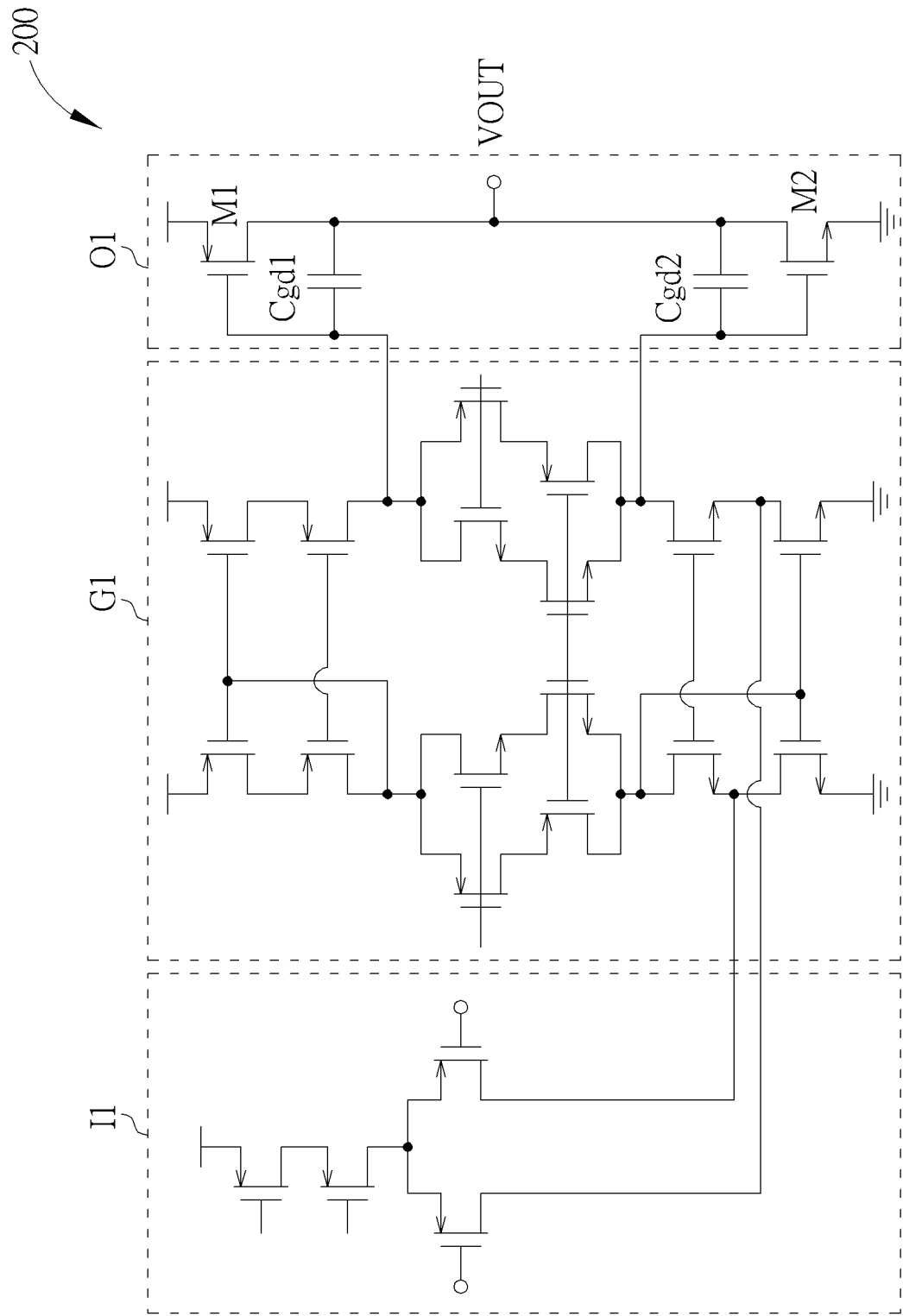
FIG. 2 is a schematic diagram of a general operational amplifier.

Please refer to FIG. 2, which is a schematic diagram of a general operational amplifier 200. The operational amplifier 200, which may be a class-AB amplifier, includes an input stage I1, a gain stage G1 and an output stage O1. The input stage I1 is configured to receive the input current signals IIN. In another embodiment, the input stage I1 may be integrated with the gain stage G1. The output stage O1 includes a high-side output transistor M1 and a low-side output transistor M2. In order to improve the stability of the operational amplifier 200, Miller compensation capacitors Cgd1 and Cgd2 are coupled between the drain terminal and the gate terminal of the high-side output transistor M1 and the low-side output transistor M2, respectively.

When the operational amplifier 200 is implemented as the operational amplifier 100 in the current integrator 10, the Miller compensation capacitors Cgd1 and Cgd2 may be regarded as parasitic capacitors of the integration operation. As mentioned above, the Miller compensation capacitors Cgd1 and Cgd2 need to be disposed in the operational amplifier 200 in consideration of the stability issue, and the size of the Miller compensation capacitors Cgd1 and Cgd2 should be large enough to achieve a satisfactory stability level. During the integration process, a part of the electric charges of the input current signal IIN may be sent to the Miller compensation capacitors Cgd1 and Cgd2; this influences the integration result which may be reflected as the electric charges stored in the integration capacitor Cint. In other words, the actually electric charges accumulated in the integration capacitor Cint is reduced due to the parasitic capacitors such as the Miller compensation capacitors Cgd1 and Cgd2, resulting in an error in the integration result.

Figure 3:
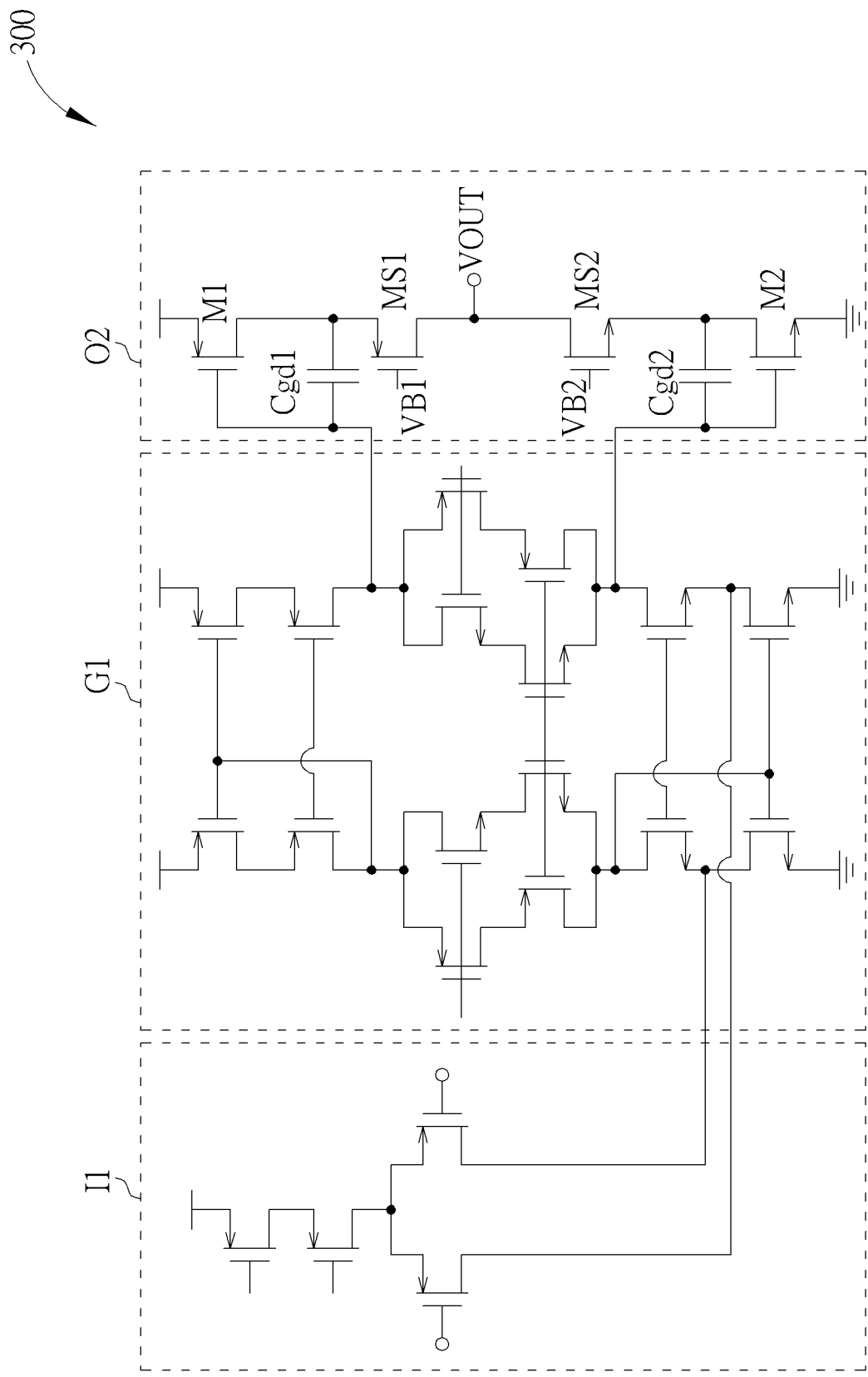
FIG. 3 is a schematic diagram of an operational amplifier according to an embodiment of the present invention.

In order to solve this problem, the present invention provides an operational amplifier for the current integrator, where the output stage of the operational amplifier is implemented with a cascode structure. Please refer to FIG. 3, which is a schematic diagram of an operational amplifier 300 according to an embodiment of the present invention. The circuit structure of the operational amplifier 300 is similar to the circuit structure of the operational amplifier 200, so circuit elements having similar functions are denoted by the same symbols. As shown in FIG. 3, the difference between the operational amplifier 300 and the operational amplifier 200 is that, the output stage O2 of the operational amplifier 300 includes two additional stack transistors MS1 and MS2. The high-side stack transistor MS1 is coupled between the high-side output transistor M1 and the output terminal of the operational amplifier 300 (which may also be considered as the output terminal of the current integrator 10 if the operational amplifier 300 is implemented as the operational amplifier 100 in the current integrator 10). The low-side stack transistor MS2 is coupled between the low-side output transistor M2 and the output terminal of the operational amplifier 300. The output transistors M1 and M2 and the stack transistors MS1 and MS2 construct the cascode structure of the output stage O2.

In the output stage O2, the high-side output transistor M1 is coupled between the high-side stack transistor MS1 and the power supply terminal, and the low-side output transistor M2 is coupled between the low-side stack transistor MS2 and the ground terminal. In general, the high-side output transistor M1 and the high-side stack transistor MS1 may be P-type metal oxide semiconductor (PMOS) transistors, and the low-side output transistor M2 and the low-side stack transistor MS2 may be N-type metal oxide semiconductor (NMOS) transistors. The Miller compensation capacitor Cgd1 is coupled between the gate terminal and the drain terminal of the high-side output transistor M1, and the Miller compensation capacitor Cgd2 is coupled between the gate terminal and the drain terminal of the low-side output transistor M2, in order to improve the stability. The gate terminal of the high-side stack transistor MS1 may receive a proper bias voltage VB1 and the gate terminal of the low-side stack transistor MS2 may receive a proper bias voltage VB2, to be adapted to the voltage level of the output signal VOUT.

With the cascode structure of the output stage O2, the stack transistors MS1 and MS2 isolate the output terminal of the operational amplifier 300 from the Miller compensation capacitors Cgd1 and Cgd2, respectively. Therefore, if the cascode structure of the operational amplifier 300 is implemented as the operational amplifier 100 in the current integrator 10, the output terminal of the current integrator 10 is not directly coupled to the Miller compensation capacitors Cgd1 and Cgd2. In such a situation, no matter how the voltage level of the output signal VOUT varies based on the integration result, the voltage across the Miller compensation capacitor Cgd1 or Cgd2 will not change evidently; this means that only a few of electric charges of the input current signal IIN are sent to charge the Miller compensation capacitors Cgd1 and Cgd2. As a result, the equivalent parasitic capacitance in the output terminal of the current integrator 10 may be significantly reduced.

Figure 4:
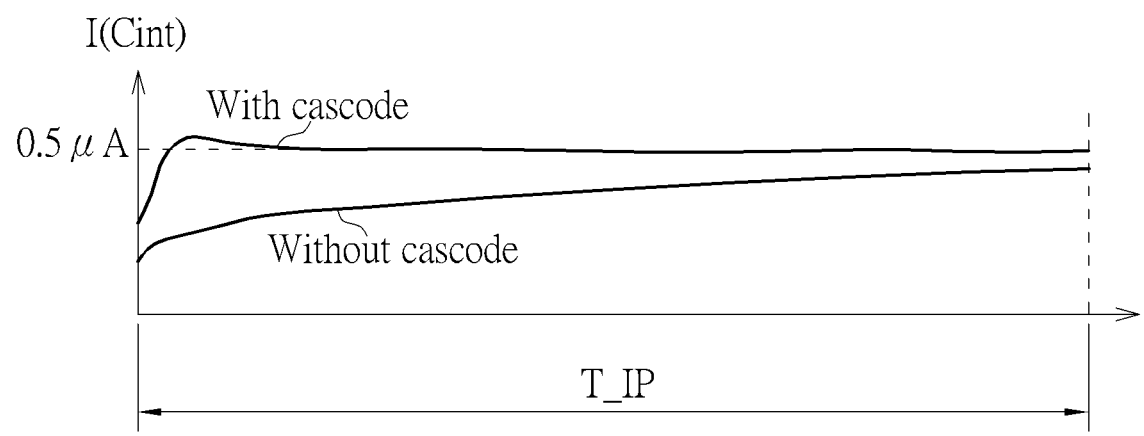
FIG. 4 is a waveform diagram of the current flowing to the integration capacitor of the current integrator in an integration period.

Please refer to FIG. 4 together with FIG. 1. FIG. 4 is a waveform diagram of the current flowing to the integration capacitor Cint of the current integrator 10 in an integration period T_IP when the operational amplifier 200 (without cascode) or the operational amplifier 300 (with cascode) is applied. The current flowing to the integration capacitor Cint stands for the part of the input current signal IIN being integrated and stored in the integration capacitor Cint. In this embodiment, the input current signal IIN equals 0.5 µA. As shown in FIG. 4, when the operational amplifier 300 with the cascode output stage is applied, the current flowing to the integration capacitor Cint rapidly reaches 0.5 µA; that is, in this integration period T_IP, most of the electric charges corresponding to the input current signal IIN are received by and stored in the integration capacitor Cint. In comparison, when the operational amplifier 200 without the cascode output stage is applied, the current flowing to the integration capacitor Cint rises slowly and finally it does not reach the steady state at the end of the integration period T_IP; that is, in this integration period T_IP, a great number of electric charges corresponding to the input current signal IIN are sent to charge parasitic capacitors such as the Miller compensation capacitors Cgd1 and Cgd2.

Please note that the present invention aims at providing a current integrator for an OLED panel, where the current integrator is configured to receive current from the OLED panel for performing parameter compensation, and the operational amplifier included in the current integrator has a cascode output stage. Those skilled in the art may make modifications and alternations accordingly. For example, the circuit structure of the operational amplifier is not limited to those described in this disclosure. As long as the output stage of the operational amplifier is coupled to the output terminal of the current integrator and a cascode structure is applied in the output stage of the operational amplifier, any type of operational amplifier may be feasible.

Figure 5:
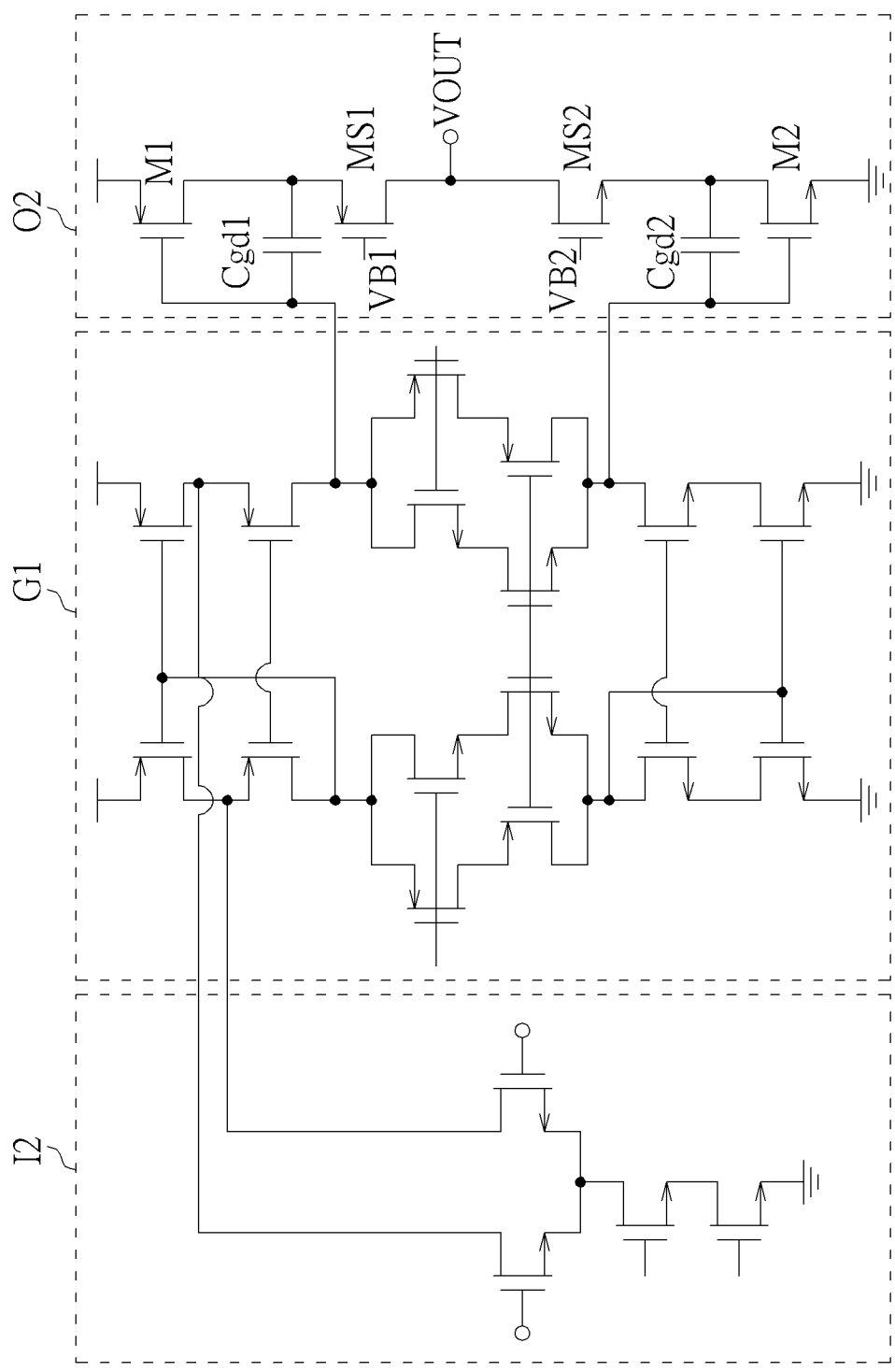
FIG. 5 is a schematic diagram of another operational amplifier according to an embodiment of the present invention.

Please refer to FIG. 5, which is a schematic diagram of another operational amplifier 500 according to an embodiment of the present invention. The circuit structure of the operational amplifier 500 is similar to the circuit structure of the operational amplifier 300, so circuit elements having similar functions are denoted by the same symbols. As shown in FIG. 5, the difference between the operational amplifier 500 and the operational amplifier 300 is that, the input stage I1 of the operational amplifier 300 is composed of differential PMOS input transistors, while the input stage I2 of the operational amplifier 500 is composed of differential NMOS input transistors. In another embodiment, the operational amplifier of the present invention may include more than one input differential pair, and/or the input stage may be integrated with the gain stage.

To sum up, the present invention provides a current integrator for an OLED panel. The current integrator may be configured to receive current from the OLED panel, for obtaining compensation information of the OLED panel. In the operational amplifier included in the current integrator, the output stage has a cascode structure. The cascode output stage isolates the Miller compensation capacitors from the output terminal of the current integrator; hence, the currents to be integrated and stored in the integration capacitor may be less susceptible to the Miller compensation capacitors. The performance of current integration may be improved by only including two stack transistors in the output stage of the operational amplifier as the cascode structure. This improvement is significant with almost no additional circuit costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current integrator for an organic light-emitting diode (OLED) panel, the current integrator comprising an operational amplifier, the operational amplifier comprising:
    an output stage, coupled to an output terminal of the current integrator, the output stage comprising:
        a first output transistor;
        a second output transistor;
        a first stack transistor, coupled between the first output transistor and the output terminal; and
        a second stack transistor, coupled between the second output transistor and the output terminal;
    wherein the current integrator is configured to receive current signals from the OLED panel and integrate the current signals.

2. The current integrator of claim 1, wherein the first output transistor is coupled between the first stack transistor and a power supply terminal, and the second output transistor is coupled between the second stack transistor and a ground terminal.

3. The current integrator of claim 1, wherein the output stage further comprises:
    a first compensation capacitor, coupled between a gate terminal of the first output transistor and a drain terminal of the first output transistor; and
    a second compensation capacitor, coupled between a gate terminal of the second output transistor and a drain terminal of the second output transistor.

4. The current integrator of claim 3, wherein the first stack transistor isolates the output terminal of the current integrator from the first compensation capacitor, and the second stack transistor isolates the output terminal of the current integrator from the second compensation capacitor.

5. The current integrator of claim 1, wherein each of the first stack transistor and the second stack transistor receives a bias voltage via a gate terminal.

6. The current integrator of claim 1, wherein the first output transistor and the first stack transistor are P-type metal oxide semiconductor (PMOS) transistors, and the second output transistor and the second stack transistor are N-type metal oxide semiconductor (NMOS) transistors.

* * * * *